United States Patent
Xie et al.

(10) Patent No.: US 12,189,473 B2
(45) Date of Patent: Jan. 7, 2025

(54) ERROR CORRECTION CODE CIRCUIT AND ERROR CORRECTION METHOD

(71) Applicant: Nanjing SemiDrive Technology LTD., Nanjing (CN)

(72) Inventors: Jun Xie, Nanjing (CN); Lihang Zhang, Nanjing (CN)

(73) Assignee: Nanjing SemiDrive Technology LTD., Nanjing (CN)

( * ) Notice: Subject to any disclaimer, the term of this patent is extended or adjusted under 35 U.S.C. 154(b) by 30 days.

(21) Appl. No.: 18/159,760

(22) Filed: Jan. 26, 2023

(65) Prior Publication Data
US 2024/0036972 A1 Feb. 1, 2024

(30) Foreign Application Priority Data
Jul. 27, 2022 (CN) .......................... 202210890012.0

(51) Int. Cl.
*G06F 11/10* (2006.01)
*G06F 11/07* (2006.01)

(52) U.S. Cl.
CPC ........ *G06F 11/102* (2013.01); *G06F 11/0772* (2013.01)

(58) Field of Classification Search
CPC ............................ G06F 11/102; G06F 11/0772
See application file for complete search history.

(56) References Cited

U.S. PATENT DOCUMENTS

| | | | | |
|---|---|---|---|---|
| 2008/0307285 A1* | 12/2008 | Kim | ...................... | H04L 1/0042 714/752 |
| 2014/0122974 A1* | 5/2014 | Yun | ...................... | G06F 11/1048 714/773 |
| 2016/0011855 A1* | 1/2016 | Manoukian | ............. | G06F 7/535 708/497 |
| 2017/0063394 A1* | 3/2017 | Halbert | ................. | G06F 3/0619 |
| 2018/0041229 A1 | 2/2018 | Yazdi et al. | | |
| 2018/0203761 A1* | 7/2018 | Halbert | .............. | G11C 29/4401 |
| 2021/0248033 A1* | 8/2021 | Boehm | ............... | G06F 11/1048 |

FOREIGN PATENT DOCUMENTS

EP 0265639 A2 5/1988

OTHER PUBLICATIONS

The European Patent Office (EPO) The Extended European Search Report for 23165016.9 Nov. 7, 2023 16 Pages.

* cited by examiner

*Primary Examiner* — Samir W Rizk
(74) *Attorney, Agent, or Firm* — ANOVA LAW GROUP, PLLC

(57) ABSTRACT

An error correction code circuit includes a first error correction code circuit configured to generate correction data and a first correction check bit according to received source data and a source check bit corresponding to the received source data, a second error correction code circuit connected to the first error correction code circuit, and configured to, according to the correction data and at least one of the first correction check bit or the source check bit, determine whether the correction data is wrong and generate a second correction check bit, and a comparison circuit connected between the first error correction code circuit and the second error correction code circuit, and configured to compare the first correction check bit with the second correction check bit and determine whether the first correction check bit is wrong.

19 Claims, 3 Drawing Sheets

ERROR CORRECTION CODE CIRCUIT AND ERROR CORRECTION METHOD

CROSS-REFERENCE TO RELATED DISCLOSURE

The disclosure claims priority of Chinese Patent Disclosure No. 202210890012.0, filed on Jul. 27, 2022, the entire content of which is incorporated herein by reference.

TECHNICAL FIELD

The present disclosure relates to the technical field of functional safety in electrical and electronic systems and in particular, to an error correction code circuit and error correction method.

BACKGROUND

In electrical and electronic systems, error checking code technology is widely used to ensure the functional safety of the system. Commonly used error checking codes include Error Detecting Code (EDC) and Error Correction Code (ECC). EDC can detect bit errors in the data stream. ECC can not only detect bit errors in the data stream, but also correct errors, thereby improving the reliability and efficiency of data transmission.

However, compared with EDC technology, there is certain hidden danger in the data error correction function of ECC technology. Once the error correction circuit in the ECC circuit breaks down, the ECC circuit may be unable to correct the wrong data, or to change the original data from correct data to the wrong data, thereby affecting functional safety, especially in some high-level functional safety application fields. The consequences are particularly serious.

SUMMARY

One aspect of the present disclosure provides an error correction code circuit including a first error correction code circuit configured to generate correction data and a first correction check bit according to received source data and a source check bit corresponding to the received source data, a second error correction code circuit connected to the first error correction code circuit, and configured to, according to the correction data and at least one of the first correction check bit or the source check bit, determine whether the correction data is wrong and generate a second correction check bit, and a comparison circuit connected between the first error correction code circuit and the second error correction code circuit, and configured to compare the first correction check bit with the second correction check bit and determine whether the first correction check bit is wrong.

Another aspect of the present disclosure provides an error correction method for an error correction code circuit, including generating correction data and a first correction check bit according to received source data and a source check bit corresponding to the received source data, according to the correction data and at least one of the first correction check bit or the source check bit, determining whether the correction data is wrong and generating a second correction check bit, and comparing the first correction check bit with the second correction check bit and determining whether the first correction check bit is wrong.

Another aspect of the present disclosure provides a chip including an error correction code circuit. The error correction code circuit includes a first error correction code circuit configured to generate correction data and a first correction check bit according to received source data and a source check bit corresponding to the received source data, a second error correction code circuit connected to the first error correction code circuit, and configured to, according to the correction data and at least one of the first correction check bit or the source check bit, determine whether the correction data is wrong and generate a second correction check bit, and a comparison circuit connected between the first error correction code circuit and the second error correction code circuit, and configured to compare the first correction check bit with the second correction check bit and determine whether the first correction check bit is wrong.

DETAILED DESCRIPTION OF THE EMBODIMENTS

Figure 1:
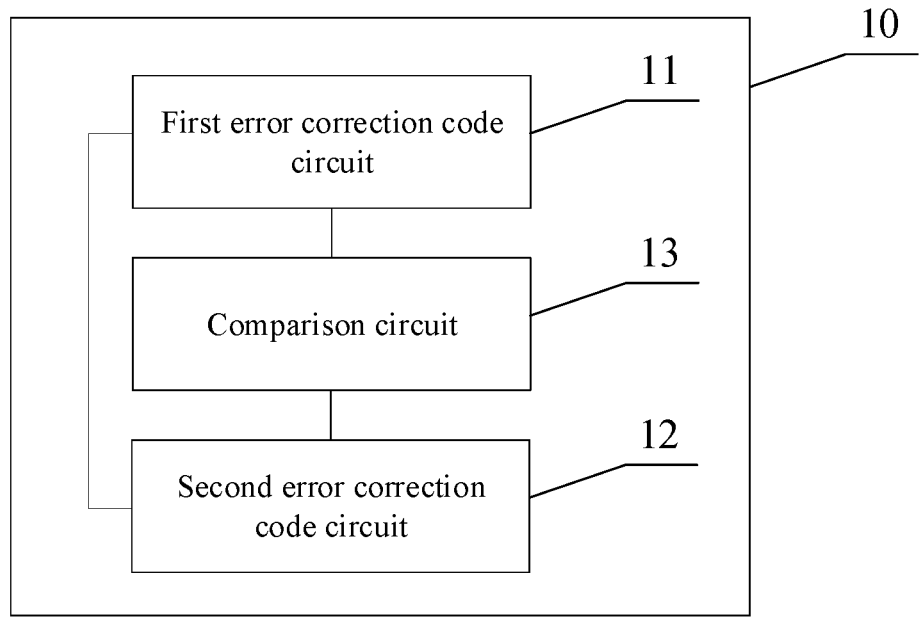
FIG. 1 is a schematic architecture diagram of an error correction code circuit according to an example embodiment consistent with the disclosure.

Technical solutions of the present disclosure will be described with reference to the drawings. It will be appreciated that the described embodiments are some rather than all of the embodiments of the present disclosure. Other embodiments conceived by those having ordinary skills in the art on the basis of the described embodiments without inventive efforts should fall within the scope of the present disclosure.

For ease of description, only the parts related to the relevant disclosure are shown in the drawings. The embodiments of the present disclosure and features in the embodiments can be combined with each other when there is no conflict.

Unless otherwise defined, the terms "a," "an," and/or "the" do not specifically refer to the singular but may also include the plural. The terms "include" only suggest that the processes and elements that have been clearly identified are included, and these processes and elements do not constitute an exclusive list, and the method or device may also include other processes or elements. The element defined by the phrase "including a . . . " does not exclude the existence of other identical elements in the process, method, commodity, or equipment that includes the element.

It should be noted that the concepts of "first error correction code circuit" and "second error correction code circuit" mentioned in the present disclosure are only used to distinguish different devices, circuits, modules, or units, and are not used to limit the sequence or interdependence of the functions performed by these devices, circuits, or modules.

It should be noted that the modifications of "one" and "a plurality of" mentioned in the disclosure are illustrative and not restrictive. Those skilled in the art should understand that unless the context clearly indicates otherwise, it should be understood as "one or more." "A plurality of" should be understood as two or more.

FIG. 1 is a schematic architecture diagram of an error correction code circuit according to an example embodiment consistent with the disclosure. As shown in FIG. 1, the error correction code circuit 10 includes a first error correction code circuit 11, a second error correction code circuit 12, and a comparison circuit 13.

The first error correction code circuit 11 is configured to generate correction data and a first correction check bit according to received source data and a source check bit corresponding to the received source data. The second error correction code circuit 12 is connected to the first error correction code circuit 11, and is configured to, according to the correction data and at least one of the first correction check bit or the source check bit, determine whether the correction data is wrong and generate a second correction check bit. The comparison circuit 13 is connected between the first error correction code circuit 11 and the second error correction code circuit 12, and is configured to compare the first correction check bit with the second correction check bit and determine whether the first correction check bit is wrong.

It should be noted that the error correction code circuit 10 can be applied to electrical and electronic systems, and an input and an output of the error correction code circuit 10 are digital signals. Specifically, the error correction code circuit 10 can be applied to digital circuit chips.

The error correction code circuit 10 can be connected to a data path of the first error correction code circuit 11. The data in the data channel can produce a corresponding check bit at a source terminal. When the check bit reaches a target terminal through the data channel, the data and the check bit can be corrected by the first error correction code circuit 11. That is, the first error correction code circuit 11 receives the source data and the corresponding check bit in the data channel, corrects the source data and the corresponding check bit, and outputs the correction data and the first correction check bit. The second error correction code circuit 12 receives the correction data output by the first error correction code circuit 11, and receives at least one of the source check bit or the first correction check bit, and outputs a signal indicating whether the correction data is wrong and a second correction check bit. In some embodiments, the second error correction code circuit 12 can also output a signal indicating whether the first correction check bit is wrong. The comparison circuit 13 inputs the first correction check bit and the second correction check bit, compares the first correction check bit with the second correction check bit, and outputs a signal indicating whether the first correction check bit is wrong according to a comparison result (i.e., whether the first correction check bit is consistent with the second correction check bit). Therefore, a verification of the correction data and the first correction check bit is realized.

Thus, not only data can be corrected by the first error correction code circuit 11, but also whether the error correction function of the first error correction code circuit 11 is normal can be detected by the two-stage error correction code circuit, realizing self-diagnosis of error correction faults, preventing the first error correction code circuit 11 from replacing the original correct data or check bit by mistake, or failing to correct the wrong data or check bit, thereby effectively ensuring functional safety of the data error correction, especially in high-level functional safety applications. In addition, the second error correction code circuit 12 only corrects the first correction check bit, but does not correct the data, thereby further ensuring the functional safety of the data error correction.

Figure 2:
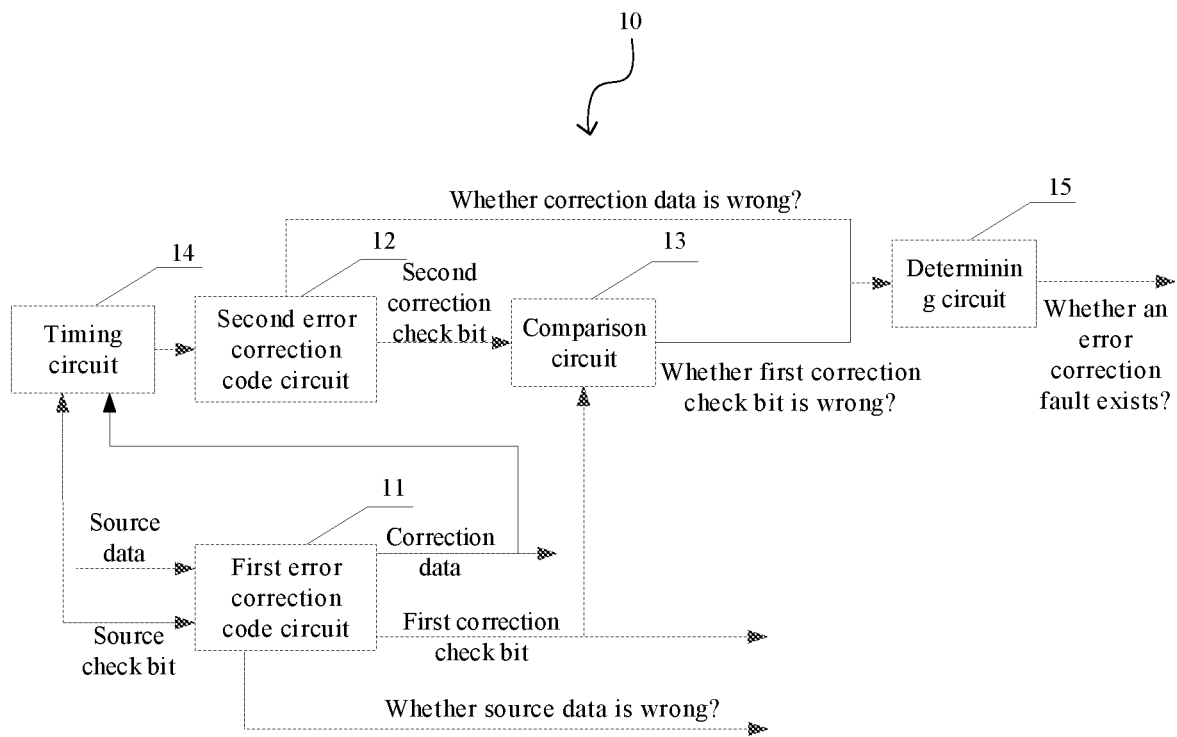
FIG. 2 is a schematic architecture diagram of an error correction code circuit according to another example embodiment consistent with the disclosure.

FIG. 2 is a schematic architecture diagram of an error correction code circuit 10 according to another example embodiment consistent with the disclosure. As shown in FIG. 2, the error correction code circuit 10 further includes a timing circuit 14. The timing circuit is configured to time-sequentially tap the correction data and the source check bit, to cause the second error correction code circuit 12 to, according to the time-sequentially tapped correction data and the time-sequentially tapped source check bit, determine whether the correction data is wrong and generate the second correction check bit.

The correction data and the source check bit are time-sequentially tapped by the timing circuit 14, so that the source check bit and the correction data after the timing tapping can be used as an input of the second error correction code circuit 12. The input of the first error correction code circuit 11 and the input of the second error correction code circuit 12 are staggered in time sequence, so as to effectively avoid interference of time and circuit signals on the data source, thereby achieving a higher fault diagnosis rate.

In some embodiments, the time-sequentially tapping on the correction data and the source check bit may include unconditional time-sequentially tapping. The unconditional time-sequentially tapping refers to, a tapping when there is a rising edge of a clock without any other condition. The tapping can be ensured to be performed on time, the interference can be further avoided, and the reliability of fault diagnosis can be improved.

Compared to the first correction check digit, the second error correction code circuit 12 adopts the source check digit as the input check digit, because the error correction code circuit 10 can be applied to parity check, the correction data and the first correction check bit are output by a same circuit (i.e., the first error correction code circuit 11), and a same error is prone to occur. In response to the correction data and the first correction check bit being used as the input of the second error correction code circuit 12, if the same error occurs in both the first error correction code circuit 11 and the second error correction code circuit 12, the error correction circuit 10 may not be able to check whether the first error correction code circuit 11 has error correction failure. In response to the correction data and the source check bit being used as the input of the second error correction code circuit 12, because the correction data and source check bit are not all the output of the first error correction code circuit 11, the same error may not occur, thereby further avoiding the interference and improving the reliability of the fault diagnosis.

In some embodiments, as shown in FIG. 2, the error correction code circuit 10 also includes a determining circuit 15. The determining circuit 15 is configured to, in response to an error in the correction data and/or the first correction check bit, determine that an error correction fault exists in the first error correction code circuit. Further, the determining circuit 15 is further configured to, in response to the correction data being correct and the first correction check bit being correct, determine that there is no error correction fault in the first error correction code circuit.

When the correction data is wrong, or when the first correction check bit is wrong, or when both the correction data and the first correction check bit are wrong, the determining circuit 15 determines that an error correction fault exists in the first error correction code circuit 11. When both the correction data and the first correction check bit are correct, the determining circuit 15 determines that there in no error correction fault in the first error correction code circuit 11. In some embodiments, after the determining circuit 15 determines that the error correction fault exists in the first error correction code circuit 11, the error correction code circuit 10 may obtain importance of the correction data, determine a corresponding processing measure can according to the importance of the correction data. The processing measure may include reporting abnormal information, retransmitting data, etc.

In some embodiments, the first error correction code circuit 11 is also configured to determine whether the source data is wrong according to the received source data and the source check bit corresponding to the source data.

Specifically, the first error correction code circuit 11 can compare the received source data according to a relevant error correction code matrix, to determine whether the source data and the relevant error correction code matrix are correspondingly consistent. If the source data and the relevant error correction code matrix are consistent, the first error correction code circuit 11 can determine that the source data is correct. If the source data and the relevant error correction code matrix are inconsistent, the first error correction code circuit 11 can determine that the source data is wrong.

It should be noted that the first error correction code circuit 11 can determine whether the source check bit is wrong while determining whether the source data is wrong. That is, the first error correction code circuit 11 can compare the source check bit corresponding to the received source data according to the relevant error correction code matrix to determine whether the source check bit and the relevant error correction code matrix are correspondingly consistent. If the source check bit and the relevant error correction code matrix are correspondingly consistent, the first error correction code circuit 11 can determine that the source check bit is correct. If the source check bit and the relevant error correction code matrix are correspondingly consistent inconsistent, the first error correction code circuit 11 can determine that the source check bit is wrong.

In some embodiments, the second error correction code circuit 12 is also configured to prompt whether the first correction check bit is wrong, to provide comprehensive feedback (e.g., whether the correction data is wrong and whether the first correction check bit is wrong) to the error information of the first error correction code circuit 11.

In some embodiments, each of the first error correction code circuit 11 and the second error correction code circuit 12 includes a single-error correction and double-error-detecting (SEC-DED) circuit.

The SEC-DED circuit can correct a single bit error and simultaneously discover two bit errors. In some embodiments, an output result of a first-stage SEC-DED circuit (i.e., the first error correction code circuit 11) is detected by adding a second-stage SEC-DED circuit (i.e., the second error correction code circuit 12), to prevent the first-stage SEC-DED circuit from replacing the original correct data or check bit by mistake, or from not correcting the wrong data or check bit, thereby effectively ensuring the functional safety of the data error correction. The second-stage SEC-DED circuit only participates in error reporting, and does not correct the actual data, which can avoid introduction of additional correction exceptions.

In an example embodiment, an ECC algorithm adopted is SECDED64, the source data (64 bit) is 0x5011280000501128, and the source check bit (8 bit) is 0x39.

In a case where the source data is wrong, and the first error correction code circuit 11 should report an error but does not report the error, the input of the first error correction code circuit 11 includes the source data (0x5011280000501120) and source check bit (0x39). The output of the first error correction code circuit 11 includes the correction data (0x5011280000501120), the first correction check bit (0x39), and source data state information indicating that the source data is correct. The input of the second error correction code circuit 12 includes the correction data (0x5011280000501120) after the time-sequentially tapping and the source check bit (0x39) after the time-sequentially tapping. The output of the second error correction code circuit 12 includes the second correction check bit (0x39), correction data state information indicating that the correction data that the first error correction code circuit 11 outputs is wrong, and a prompt message indicating that the first correction check bit output by the first error correction code circuit 11 is correct.

In a case where the source check bit is wrong, and the first error correction code circuit 11 should report an error but does not report the error, the input of the first error correction code circuit 11 includes the source data (0x5011280000501128) and the source check bit (0x38). The output of the first error correction code circuit 11 includes the correction data (0x5011280000501128), the first correction check bit (0x38), and the source data state information indicating that the source data is correct. The input of the second error correction code circuit 12 includes the correction data (0x5011280000501128) after the time-sequentially tapping and the source check bit (0x38) after the time-sequentially tapping. The output of the second error correction code circuit 12 includes the second correction check bit (0x39), the correction data state information indicating that the correction data output by the first error correction code circuit 11 is correct, and a prompt message indicating that the first correction check bit output by the first error correction code circuit 11 is wrong.

In a case where the source data and the source check bit are correct, but the correction data output by the first error correction code circuit 11 is wrong, the input of the first error correction code circuit 11 includes the source data (0x5011280000501128) and the source check bit (0x39). The output of the first error correction code circuit 11 includes the correction data (0x5011280000501120), the first correction check bit (0x39), and the source data state information indicating that the source data is correct. The input of the second error correction code circuit 12 includes the correction data (0x5011280000501120) after the time-sequentially tapping and the source check bit (0x39) after the time-sequentially tapping. The output of the second error correction code circuit 12 includes the second correction check bit (0x39), the correction data state information indicating that the correction data output by the first error correction code circuit 11 outputs is wrong, and a prompt message indicating that the first correction check bit output by the first error correction code circuit 11 is correct.

In a case where the source data and the source check bit are correct, but the first correction check bit output by the first error correction code circuit 11 is wrong, the input of the first error correction code circuit 11 includes the source data (0x5011280000501128) and the source check bit (0x39). The output of the first error correction code circuit 11 includes the correction data (0x5011280000501128), the first correction check bit (0x38), and the source data state information indicating that the source data is correct. The input of the second error correction code circuit 12 includes the correction data (0x5011280000501128) after the time-sequentially tapping and the source check bit (0x39) after the time-sequentially tapping. The output of the second error correction code circuit 12 includes the second correction check bit (0x39), the correction data state information indicating that the correction data output by the first error correction code circuit 11 is correct, and a prompt message indicating that the first correction check bit output by the first error correction code circuit 11 is wrong.

According to the received source data and the source check bit corresponding to the source data, the first error correction code circuit 11 generates the correction data and the first correction check bit, and sends the correction data and the first correction check bit to the second error correction code circuit 12. According to the correction data and at least one of the source check bit or the first correction check bit, the second error correction code circuit 12 determines whether the correction data is wrong, and generates the second correction check bit. The comparison circuit 13 compares the first correction check bit and the second correction check bit to determine whether the first correction check bit is wrong. As a result, not only the data can be error corrected, but also whether the error correction function is normal can be detected through the two-stage error correction code circuit, thereby realizing self-diagnosis of error correction faults, and preventing the first error correction code circuit from incorrectly replacing the data or check bit, or from not correcting the wrong data or check bit, so as to effectively ensure the safety of the data error correction function. The effect is particularly significant in high-level functional safety applications.

Figure 3:
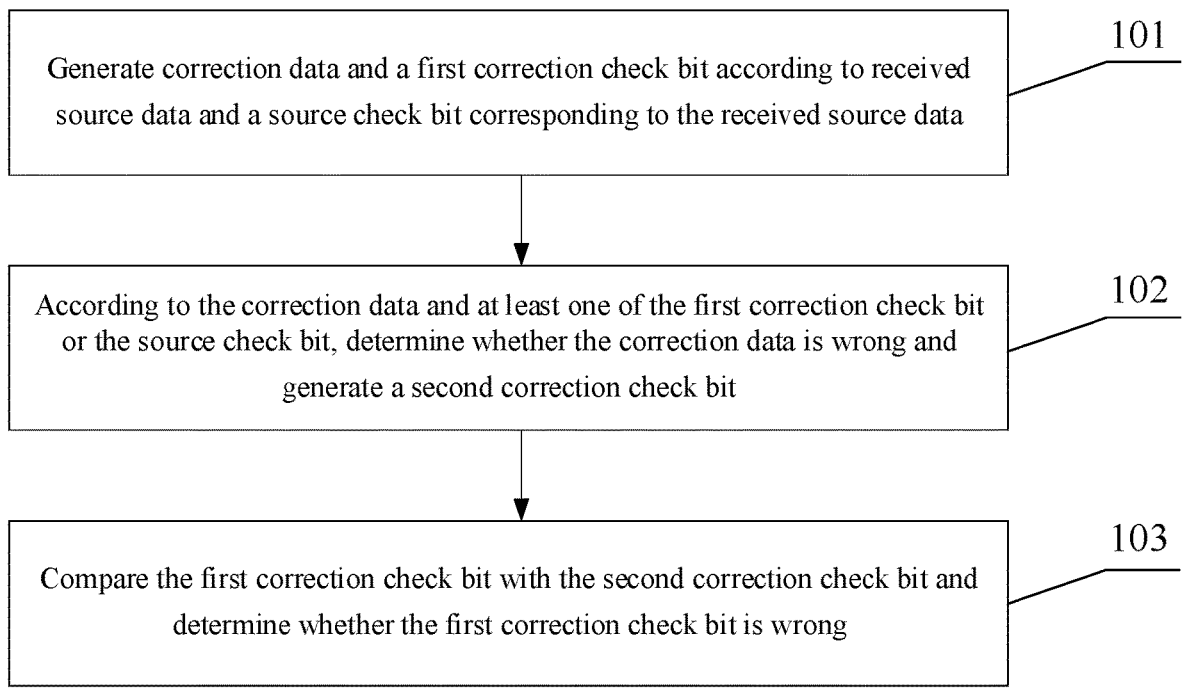
FIG. 3 is a schematic flow chart of an error correction method consistent with embodiments of the disclosure.

FIG. 3 is a schematic flow chart of an error correction method consistent with embodiments of the disclosure. As shown in FIG. 3, the error correction method includes the following processes.

At process 101, correction data and a first correction check bit are generated according to received source data and a source check bit corresponding to the received source data.

As process 102, according to the correction data and at least one of the first correction check bit or the source check bit, whether the correction data is wrong is determined and a second correction check bit is generated.

As process 103, the first correction check bit is compared with the second correction check bit and whether the first correction check bit is wrong is determined.

Figure 4:
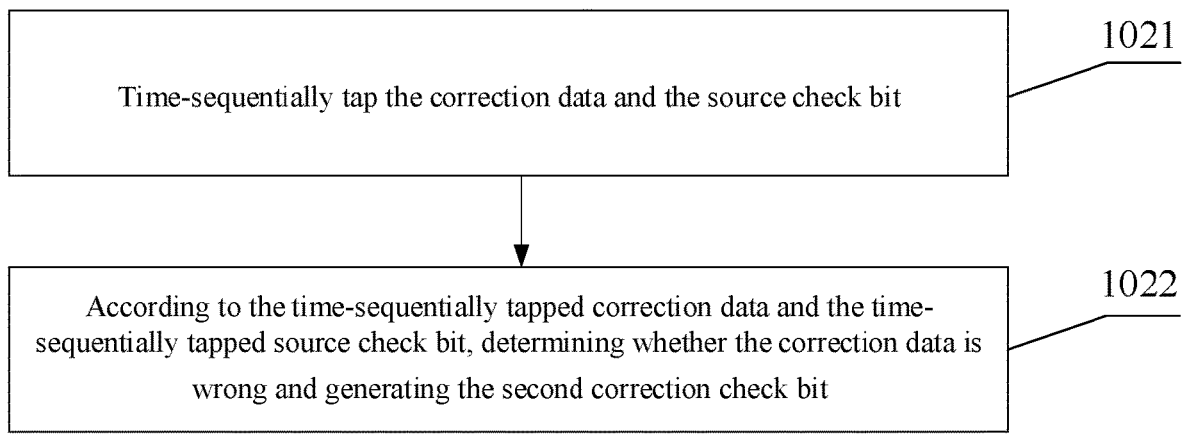
FIG. 4 is a schematic flow chart of process 102 in FIG. 3.

FIG. 4 is a schematic flow chart of process 102 in FIG. 3. As shown in FIG. 4, process 102 includes the following processes.

At process 1021, the correction data and the source check bit are time-sequentially tapped.

At process 1022, according to the time-sequentially tapped correction data and the time-sequentially tapped source check bit, whether the correction data is wrong is determined and the second correction check bit is generated.

In some embodiments, the error correction method may also include in response to an error in the correction data and/or the first correction check bit, determining that an error correction fault exists in the error correction code circuit.

In some embodiments, the error correction method may also include prompting whether the first correction check bit is wrong.

In some embodiments, the error correction method may also include determining whether the source data is wrong according to the received source data and the source check bit corresponding to the source data.

For simplification purposes, detailed descriptions of the error correction method may be omitted and references can be made to the descriptions of the example error correction code circuit.

According to the received source data and the source check bit corresponding to the source data, the correction data and the first correction check bit are generated. According to the correction data and at least one of the source check bit or the first correction check bit, whether the correction data is wrong is determined, and the second correction check bit is generated. Then the first correction check bit is compared with the second correction check bit to determine whether the first correction check bit is wrong. As a result, not only the data can be error corrected, but also whether the error correction function is normal can be detected through the two-stage error correction code circuit, thereby realizing self-diagnosis of error correction faults, and preventing the first error correction code circuit from incorrectly replacing the data or check bit, or from not correcting the wrong data or check bit, so as to effectively ensure the safety of the data error correction function. The effect is particularly significant in high-level functional safety applications.

Figure 5:
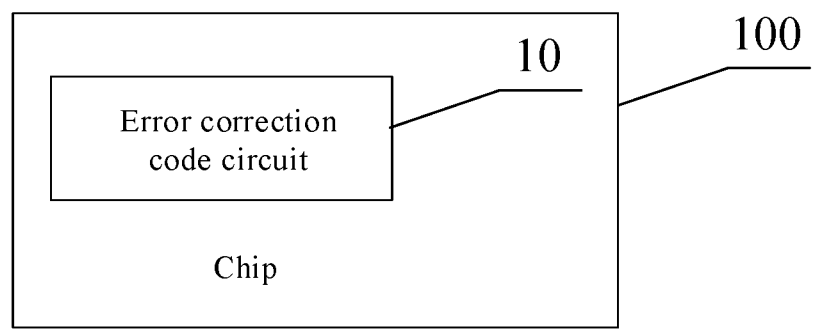
FIG. 5 is a schematic structural diagram of a chip consistent with embodiments of the disclosure.

FIG. 5 is a schematic structural diagram of a chip 100 consistent with embodiments of the disclosure. As shown in FIG. 5, the chip 100 includes the error correction code circuit 10.

The chip consistent with the embodiments of the present disclosure includes the error correction code circuit 10, which can not only correct the data, but also determined whether the error correction function is normal, thereby realizing self-diagnosis of error correction faults, so as to effectively ensure the safety of the data error correction function. The effect is particularly significant in high-level functional safety applications.

Other embodiments of the disclosure will be apparent to those skilled in the art from consideration of the specification and practice of the embodiments disclosed herein. It is intended that the specification and examples be considered as example only and not to limit the scope of the disclosure, with a true scope and spirit of the invention being indicated by the following claims.

What is claimed is:

1. An error correction code circuit, comprising:
   a first error correction code circuit configured to generate correction data and a first correction check bit according to received source data and a source check bit corresponding to the received source data;
   a timing circuit configured to time-sequentially tap the correction data from the first error correction code circuit and the source check bit corresponding to the source data, to obtain time-sequentially tapped correction data and time-sequentially tapped source check bit, the time-sequentially tapping performed by the timing circuit including unconditional time-sequentially tapping;
   a second error correction code circuit connected to the first error correction code circuit through the timing circuit, and configured to, according to the time-sequentially tapped correction data and at least one of the first correction check bit or the time-sequentially tapped source check bit, determine whether the correction data is wrong and generate a second correction check bit; and
   a comparison circuit connected between the first error correction code circuit and the second error correction code circuit, and configured to compare the first correction check bit with the second correction check bit and determine whether the first correction check bit is wrong.

2. The error correction code circuit of claim 1, further comprising:
a determining circuit configured to, in response to an error in the correction data and/or the first correction check bit, determine that an error correction fault exists in the first error correction code circuit.

3. The error correction code circuit of claim 2, wherein the determining circuit is further configured to, in response to the correction data being correct and the first correction check bit being correct, determine that there is no error correction fault in the first error correction code circuit.

4. The error correction code circuit of claim 1, wherein the second error correction code circuit is further configured to prompt whether the first correction check bit is wrong.

5. The error correction code circuit of claim 1, wherein the first error correction code circuit is further configured to determine whether the source data is wrong according to the received source data and the source check bit corresponding to the source data.

6. The error correction code circuit of claim 1, wherein each of the first error correction code circuit and the second error correction code circuit includes a single-error correction and double-error-detecting (SEC-DED) circuit.

7. The error correction code circuit of claim 1, wherein the second error correction code circuit is configured to, according to the time-sequentially tapped correction data and the time-sequentially tapped source check bit, determine whether the correction data is wrong and generate the second correction check bit.

8. The error correction code circuit of claim 1, wherein the unconditional time-sequentially tapping includes a tapping in response to a rising edge of a clock without a condition.

9. The error correction code circuit of claim 1, wherein the first error correction code circuit is further configured to determine whether the source check bit is wrong, including:
comparing the source check bit corresponding to the received source data and a relevant error correction code matrix to determine whether the source check bit and the relevant error correction code matrix are correspondingly consistent; and
in response to determining that the source check bit and the relevant error correction code matrix are not correspondingly consistent, determining that the source check bit is wrong.

10. An error correction method for an error correction code circuit, comprising:
generating correction data and a first correction check bit according to received source data and a source check bit corresponding to the received source data;
time-sequentially tapping the correction data and the source check bit to obtain time-sequentially tapped correction data and time-sequentially tapped source check bit, the time-sequentially tapping including unconditional time-sequentially tapping;
according to the time-sequentially tapped correction data and at least one of the first correction check bit or the time-sequentially tapped source check bit, determining whether the correction data is wrong and generating a second correction check bit; and
comparing the first correction check bit with the second correction check bit and determining whether the first correction check bit is wrong.

11. The method of claim 10, further comprising:
in response to an error in the correction data and/or the first correction check bit, determining that an error correction fault exists in the error correction code circuit.

12. The method of claim 10, further comprising:
prompting whether the first correction check bit is wrong.

13. The method of claim 10, further comprising:
determining whether the source data is wrong according to the received source data and the source check bit corresponding to the source data.

14. A chip comprising:
an error correction code circuit, comprising:
a first error correction code circuit configured to generate correction data and a first correction check bit according to received source data and a source check bit corresponding to the received source data;
a timing circuit configured to time-sequentially tap the correction data from the first error correction code circuit and the source check bit corresponding to the source data, to obtain time-sequentially tapped correction data and time-sequentially tapped source check bit, the time-sequentially tapping performed by the timing circuit including unconditional time-sequentially tapping;
a second error correction code circuit connected to the first error correction code circuit through the timing circuit, and configured to, according to the time-sequentially tapped correction data and at least one of the first correction check bit or the time-sequentially tapped source check bit, determine whether the correction data is wrong and generate a second correction check bit; and
a comparison circuit connected between the first error correction code circuit and the second error correction code circuit, and configured to compare the first correction check bit with the second correction check bit and determine whether the first correction check bit is wrong.

15. The chip of claim 14, wherein the error correction code circuit further includes:
a determining circuit configured to, in response to an error in the correction data and/or the first correction check bit, determine that an error correction fault exists in the first error correction code circuit.

16. The chip of claim 15, wherein the determining circuit is further configured to, in response to the correction data being correct and the first correction check bit being correct, determine that there is no error correction fault in the first error correction code circuit.

17. The chip of claim 14, wherein the second error correction code circuit is further configured to prompt whether the first correction check bit is wrong.

18. The chip of claim 14, wherein the first error correction code circuit is further configured to determine whether the source data is wrong according to the received source data and the source check bit corresponding to the source data.

19. The chip of claim 14, wherein each of the first error correction code circuit and the second error correction code circuit includes a single error correction and double error detection circuit.

* * * * *